(12) United States Patent
Ke et al.

(10) Patent No.: US 8,154,107 B2
(45) Date of Patent: Apr. 10, 2012

(54) SEMICONDUCTOR DEVICE AND A METHOD OF FABRICATING THE DEVICE

(75) Inventors: Chung-Hu Ke, Taipei (TW); Chih-Hsin Ko, Fongshan (TW); Wen-Chin Lee, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 236 days.

(21) Appl. No.: 11/703,365

(22) Filed: Feb. 7, 2007

(65) Prior Publication Data

US 2008/0185659 A1    Aug. 7, 2008

(51) Int. Cl.
*H01L 23/58*    (2006.01)
(52) U.S. Cl. .................. 257/649; 257/E29.295; 438/197
(58) Field of Classification Search .................. 257/213, 257/288, 314, 324, 629, 632, 635, 637, 640, 257/649, E29.295, E29.297, E29.298, E29.299
See application file for complete search history.

(56) References Cited

U.S. PATENT DOCUMENTS

| | | | |
|---|---|---|---|
| 2004/0150033 A1* | 8/2004 | Kinoshita et al. | 257/315 |
| 2005/0093078 A1 | 5/2005 | Chan et al. | |
| 2005/0199945 A1* | 9/2005 | Kodama et al. | 257/324 |
| 2005/0199958 A1 | 9/2005 | Chen et al. | |
| 2005/0214998 A1 | 9/2005 | Chen et al. | |
| 2005/0260810 A1 | 11/2005 | Cheng et al. | |
| 2006/0003597 A1* | 1/2006 | Golonzka et al. | 438/778 |
| 2006/0006543 A1* | 1/2006 | Shimazu et al. | 257/762 |
| 2006/0024879 A1* | 2/2006 | Fu et al. | 438/216 |
| 2007/0063286 A1* | 3/2007 | Kotani | 257/365 |
| 2007/0278590 A1* | 12/2007 | Zhu et al. | 257/374 |
| 2008/0150033 A1* | 6/2008 | Greene et al. | 257/369 |
| 2008/0150145 A1* | 6/2008 | King et al. | 257/762 |
| 2009/0045466 A1* | 2/2009 | Nakamura | 257/369 |

OTHER PUBLICATIONS

Characteristic of Silicon oxid (http://www.memsnet.org/material/glasssio2bulk/), google search.*
Ito, S., et al., "Mechanical Stress Effect of Etch-Stop Nitride and its Impact on Deep Submicron Transistor Design," International Electron Devices Meeting, Copyright 2000 IEEE, pp. 247-250.
Ootsuka, F., et al., "A Highly Dense, High-Performance 130nm node CMOS Technology for Large Scale System-on-a-Chip Applications," International Electron Devices Meeting, Copyright 2000 IEEE, pp. 575-578.
Shimizu, A., et al., "Local Mechanical-Stress Control (LMC): A New Technique for CMOS-Performance Enhancement," International Electron Devices Meeting, Copyright 2001 IEEE, pp. 433-436.
Pidin, S., et al., "MOSFET Current Drive Optimization Using Silicon Nitride Capping Layer for 65-nm Technology Node," 2004 Symposium on VLSI Technology Digest of Technical Papers, Copyright 2004 IEEE, pp. 54-55.
Wolf, S., et al., "Basics of Thin Films," Silicon Processing for the VLSI Era, vol. 1—Process Technology, Second Edition, pp. 109-112.

* cited by examiner

*Primary Examiner* — William D Coleman
*Assistant Examiner* — Su Kim
(74) *Attorney, Agent, or Firm* — Slater & Matsil, L.L.P.

(57) ABSTRACT

A semiconductor device having at least one transistor covered by an ultra-stressor layer, and method for fabricating such a device. In an NMOS device, the ultra-stressor layer includes a tensile stress film over the source and drain regions, and a compressive stress film over the poly region. In a PMOS device, the ultra-stressor layer includes a compressive stress film over the source and drain regions and a tensile stress film over the poly region. In a preferred embodiment, the semiconductor device includes a PMOS transistor and an NMOS transistor forming a CMOS device and covered with an ultra stressor layer.

18 Claims, 19 Drawing Sheets

SEMICONDUCTOR DEVICE AND A METHOD OF FABRICATING THE DEVICE

TECHNICAL FIELD

The present invention relates generally to the field of semiconductor devices, and more particularly relates to a semiconductor device having an ultra-stressor layer, and to a method for fabricating such a device.

BACKGROUND

Small electronic devices are today used in a wide variety of applications and have become a ubiquitous part of modern society. These applications include computers, telephony, and home entertainment, among many others. One reason for the widespread use of these devices is that recent advances in technology have expanded their capabilities while at the same time lowering their cost. A key part of this advancing technology has been the development of semiconductor devices.

Semiconductors are materials that conduct electricity only under certain conditions, which often include the presence of a small electrical charge. This enables the manufacture of solid-state switches—those that have no moving parts. Other standard (and new) electrical devices can be created out of semiconductors as well. In addition to having no moving components parts that are subject to fatigue or other mechanical failure, solid-state devices can be fabricated in extremely small sizes. Very small, even microscopic electrical components are now used to provide the multitude of switches and capacitors necessary for today's electronics applications.

The processes used to fabricate these tiny semiconductor devices are numerous, but the basic process may be described generally. A material, such as silicon, is produced for use as a base, or substrate, upon which various electrical components will be built. This material is then formed into an appropriate shape, usually a thin slice called a wafer. The pure silicon is then selectively treated with one or more materials called dopants, such as ionized boron or phosphorus. The introduction of these impurities begins the process of creating the desired semiconductive properties. Various structures may then be formed at or near one surface of the wafer to construct the desired components.

These surface structures may be formed by etching, whereby the surface is exposed to an etching agent. Or, more typically, the surface is selectively etched using a process known as photolithography. In photolithography, a material called photoresist, or simply resist, is deposited evenly over the wafer surface. The resist is then selectively treated with a light source directed though a patterned mask so that some portions of the resist are exposed to the light energy while others are not. The exposed portions are developed to be either strengthened or weakened, depending on the type of resist material used, so that the weaker portions can be washed away using a solvent that will not otherwise affect the wafer or any structures already formed on it. The resist that remains however, will prevent the etching of the wafer surface in the areas it covers when a stronger etching agent is used in subsequent etching steps. When the desired wafer etching has been accomplished, the remaining photoresist is removed using an appropriate solvent. Note that the photolithography process may also be used to create a photoresist pattern for selective epitaxy, deposition, or doping as well.

An exemplary transistor is shown in FIG. 1. FIG. 1 is an illustration showing in cross-section the basic components of a MOSFET (metal-oxide semiconductor field effect transistor) 10. Silicon forms the substrate 15 upon which various devices may be fabricated. The transistor includes a gate 20 having a gate electrode 25 the gate electrode made of a conductive material such as a metal. Separating the gate electrode from the substrate 15 is a thin gate oxide layer 30. In the transistor 10 of FIG. 1, spacers 35 are positioned on either side of the gate electrode 25. Conductive regions called a source 40 and a drain 45 are formed in the substrate 15 on either side of the spacers 35. Source 40, drain 45, and gate electrode 25 are each coupled, respectively, to electrical contacts 50, 51, 52, each of which may in turn be connected to external components (not shown) so that electrical current may flow to and from these transistor components when appropriate. When a small electrical charge is applied to gate electrode 25 via contact 52, then current will flow between drain 45 and source 40 via channel region 5. These MOSFET transistors are very small, for example, the gate electrode 25 of MOSFET 10 may be no more than 100 nm in width.

Different types of transistors may be formed by selecting the types of materials used to make them. For example, if source region 40 and drain region 45 are formed by doping the substrate 15 with boron ions, p-wells are created. In a PMOS transistor, positive charge carriers (holes) move between the source and drain when the transistor is activated by an applied voltage at gate electrode 25. In another example, doping selectively substrate 15 with phosphorous ions creates n-type source and drain regions between which negative charge carriers (electrons) may flow. This type of transistor may be called an NMOS transistor. An NMOS transistor and a PMOS transistor may be used together to advantage in what may be referred to as a complimentary metal oxide semiconductor (CMOS) device. In a CMOS device an NMOS transistor and a PMOS transistor or similar devices are formed adjacent to each other. "Adjacent" here means in close proximity, even though the two devices are electrically isolated.

As semiconductor devices become ever smaller, optimizing current flow becomes a high priority. A number of enhancements have been developed. For example, selective stress forces acting as semiconductor devices such as transistors improve current flow and other electrical properties in such components, resulting in an increase in overall system performance and reliability. The drive currents in MOSFETs may be enhanced by the addition of a pre-stressed layer, such as an etch stop layer, over the transistor. This enhancement is especially noticeable in the relatively-smaller devices now being fabricated. Both p-channel and n-channel drive currents may be improved in this way, although different stresses are required for each type. Tensile stress increases n-drive current, while compressive stress improves p-drive current. Unfortunately, in a CMOS device, both are present in close proximity to each other. The stress characteristics benefiting one of the CMOS devices may degrade the performance of an adjacent device. Needed, then is a structure formed to exploit the positive effects of stress engineering a CMOS device, while minimizing the negative effects. The present invention provides a novel way of applying stress forces that is especially of advantage when used in a CMOS device.

SUMMARY OF THE INVENTION

These and other problems are generally solved or circumvented, and technical advantages are generally achieved, by preferred embodiments of the present invention, which provide a semiconductor device having an ultra stressor layer to promote enhanced current flow and a method of making such a device In accordance with a preferred embodiment of the present invention, one or more transistors is formed on a substrate, then the transistors are covered with a contact etch stop layer. The contact etch stop layer (CESL) is overlain with an inter-layer dielectric (ILD) layer. Additional stress is selectively imparted on the transistors by the addition of an appropriately formed ILD stressor layer, and the structure is then covered with an inter-metal dielectric (IMD) layer.

In one particularly preferred embodiment, the semiconductor device is a CMOS device and the CESL is a tensile stress film overlying (in close proximity, if not immediately adjacent) the source area and the drain area of the NMOS portion of the CMOS device and overlaying the poly gate area of the PMOS portion. In this embodiment, a compressive stress film is formed over the source area and the drain area of the PMOS portion of the CMOS device, and the ILD stressor layer is a compressive stress film overlying the poly gate of the NMOS portion. In another embodiment, the semiconductor device is an NMOS device including a transistor having a poly gate, a compressive stress film over the poly area, a source region and a drain region formed in the substrate, and tensile stress film formed over the source and drain regions.

In another aspect, the present invention is a method of fabricating a semiconductor device having an ultra-stressor layer. The process includes the steps of providing a substrate such as a silicon wafer, forming one or more transistors and a contact etch stop layer over the transistors. Above the CESL, an ILD is deposited. An ILD-stressor layer is then added. Finally, an IMD is formed on top of the ILD-stressor. The method then continues with packaging or the performance of further fabrication steps, as appropriate.

In one particularly preferred embodiment, the present invention is a method of fabricating a CMOS device, including forming an NMOS transistor and a PMOS transistor on a substrate, forming a compressive stress etch stop layer over the source region and the drain region of the PMOS transistor, forming a tensile stress etch stop layer over the source region and the drain region of the NMOS transistor, forming a tensile stress ILD over the PMOS poly region, and forming a compressive ILD ofer the NMOS poly region.

A more complete appreciation of the present invention and the scope thereof can be obtained from the accompanying drawings that are briefly summarized below, the following detailed description of the presently-preferred embodiments of the present invention, and the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a CMOS device transistor having a silicon nitride (SiN) ultra-stressor layer. The invention may also be applied, however, to other types of semiconductor devices and use other materials as well.

Figure 2:
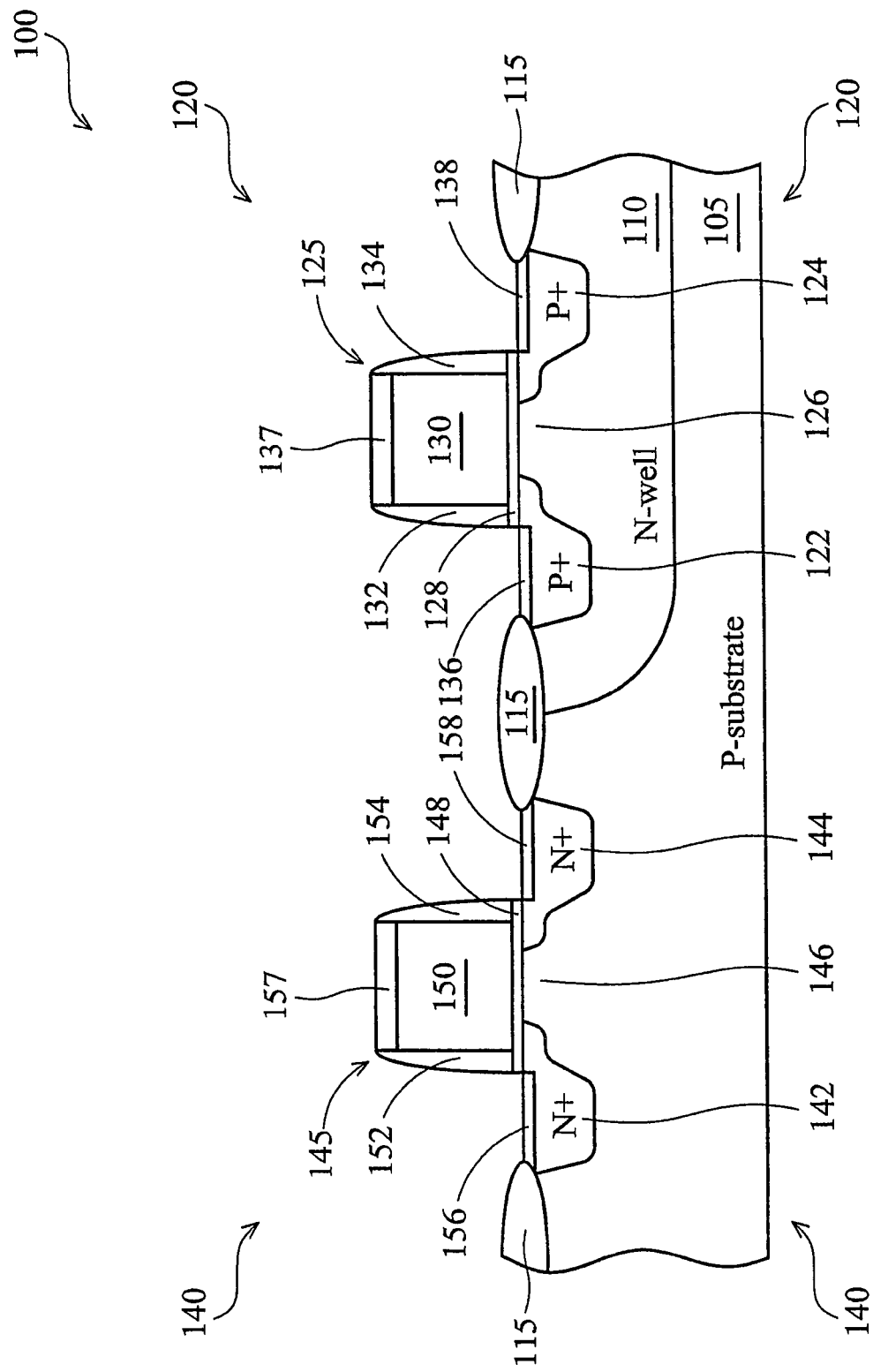
FIG. 2 is an illustration showing in cross-section the basic components of an exemplary CMOS (complimentary metal oxide semiconductor) device.

A typical CMOS device 100 is shown in FIG. 2. FIG. 2 is a side cross-sectional view illustrating a typical CMOS device 100 at an intermediate stage of the fabrication process. At this stage, CMOS device 100 includes a PMOS device 120 and an NMOS device 140, which have been constructed in a series of steps on substrate 105. Substrate 105 is formed, in this example, of a p-type doped silicon and so n-well 110 is created (by selective ion implantation) as a site for the construction of PMOS device 120. Field oxide regions 115 are formed to electrically isolate PMOS device 120 and NMOS device 140 from each other, and also from the many other similar and dissimilar devices that are also being fabricated on substrate 105.

PMOS device 120 includes a p-doped source region 122 and a p-doped drain region 124, formed within n-well 110 of p-substrate 105. Source region 122 and drain region 124 are disposed substantially to either side of gate 125, although shallow extensions can be seen in FIG. 2 to extend beneath gate electrode 130, narrowing the channel 126 situated between them. Gate electrode 130 is physically separated from channel 126 and the source and drain regions defining it by a gate oxide 128. Spacers 132 and 134 are disposed on either side of gate electrode 130 and above a portion of source region 122 and drain region 124, respectively, although they are physically separated from those regions by gate oxide 128. Electrical contacts 136 and 138 are, in this example, formed at the upper surfaces not covered by gate oxide 128 of source 122 and drain 124. Contact 137 is disposed at the top of gate electrode 130.

NMOS device 140 is isolated from PMOS device 120 (and from n-well 110) by a field oxide region 115. NMOS device 140 includes an n-doped source region 142 and an n-doped drain region 144, formed in p-substrate 105. Source region 142 and drain region 144 are disposed substantially to either side of gate 145, although as with PMOS device 120, shallow source and drain extensions lie beneath a portion of NMOS gate electrode 150. A channel 146 is thereby defined in substrate 105 between source 142 and drain 144.

NMOS gate electrode 150 is physically separated from channel 146 and the source and drain regions defining it by a gate oxide 148. Spacers 152 and 154 are disposed on either side of NMOS gate electrode 150 and above a portion of n-doped source region 142 and n-doped drain region 144, respectively, although they are physically separated from those regions by gate oxide 148. Electrical contacts 156 and 158 are, in this example, formed at the upper surface not covered by gate oxide 148 of n-doped source region 142 and n-doped drain region 144. Contact 157 is disposed at the top of NMOS gate electrode 150.

As mentioned above, stress engineering the layers to be added to CMOS device 100 in later fabrication steps (than are shown in FIG. 2) may improve the current drivability for channels 126 and 146. Such stresses may be induced, for example, by a CESL (contact etch stop layer) or ILD (interlayer dielectric) layer formed over gates 125 and 145. Simply adding either a tensile-stress or a compressive-stress layer, however, is not preferred, because such a layer may have negative effects on either the NMOS device 140 or the PMOS device 120. One solution has been to selectively form one type of stress layer over one of the devices and another type of stress layer over the other. While this represents an improvement, it is nevertheless not preferred in all applications. The present invention, on the other hand, is directed to a novel stress-engineering configuration that has been found to provide an advantageous configuration while minimizing the adverse effects on adjacent devices.

Figure 3:
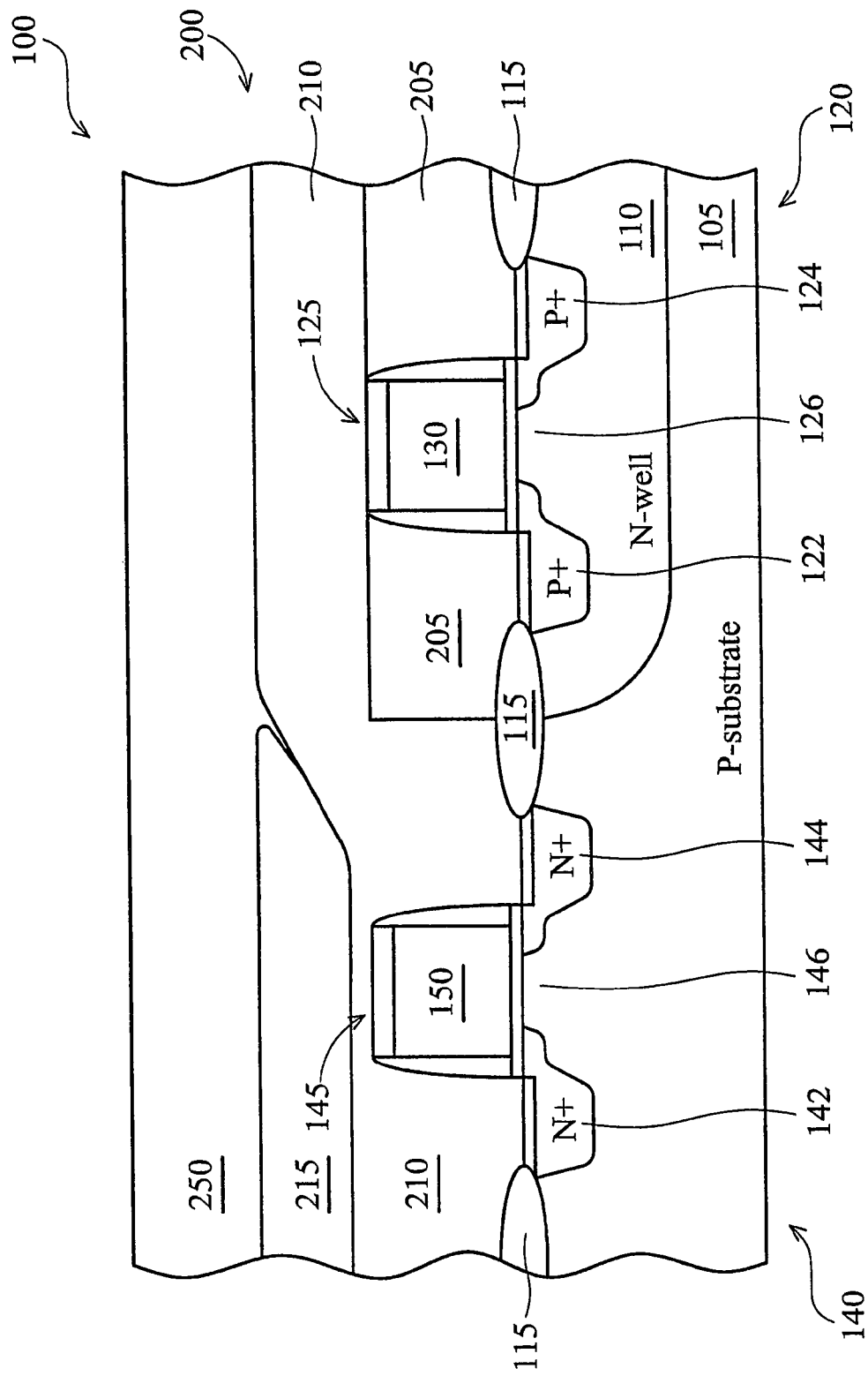
FIG. 3 is an illustration showing in cross-section a CMOS device according to an embodiment of the present invention.

One such device is shown in FIG. 3. FIG. 3 is a side cross-section view of CMOS device 100 fabricated according to an embodiment of the present invention. Note that at the stage illustrated in FIG. 3, which is more advanced than is shown in FIG. 2, fabrication of CMOS device 100 may be at or near completion. It is just as likely, however, that a number of additional layers remain to be added. In either case, FIG. 3 shows the CMOS device 100 of FIG. 2 at a later stage of construction. For clarity, some of the reference numbers shown in FIG. 2 have been omitted in FIG. 3.

Specifically, in this embodiment, a tensile stress layer is formed over the NMOS source and drain regions, while a compressive stress layer is formed above the PMOS source and drain regions. A compressive stress layer is formed over the NMOS poly structure, while a tensile stress layer is formed over the PMOS poly structure. In the embodiment of FIG. 3, stress region 200 includes a number of stress-inducing layers in accordance with the inventive concept described above. Stress region 200 includes a first compressive layer 205, which is generally disposed on either side of gate 125 and as a consequence over PMOS source region 122 and PMOS drain region 124. In this embodiment, first compressive layer 205 does not extend significantly if al all above the PMOS gate structure 125, although it may in other embodiments.

In the embodiment of FIG. 3, tensile stress layer 210 is disposed over the PMOS gate structure 125 and as a consequence over the first compressive layer 205 as well. Again, while a portion of the first compressive stress layer 205 may lie between the PMOS gate structure 125 and tensile stress layer 210; this is not the case in this embodiment. Finally, in this embodiment stress region 200 includes a second compressive stress layer 215 disposed over NMOS gate structure 145 and, as a consequence, over tensile stress layer 210 as well. In this embodiment, an ILD layer 250 is disposed above stress region 200, and fills any gap formed between second compressive stress layer 215 and the upper portion of tensile stress layer 210 as well. In one embodiment, ILD layer 250 is stress-neutral, although this is not necessarily the case.

Figure 4A:
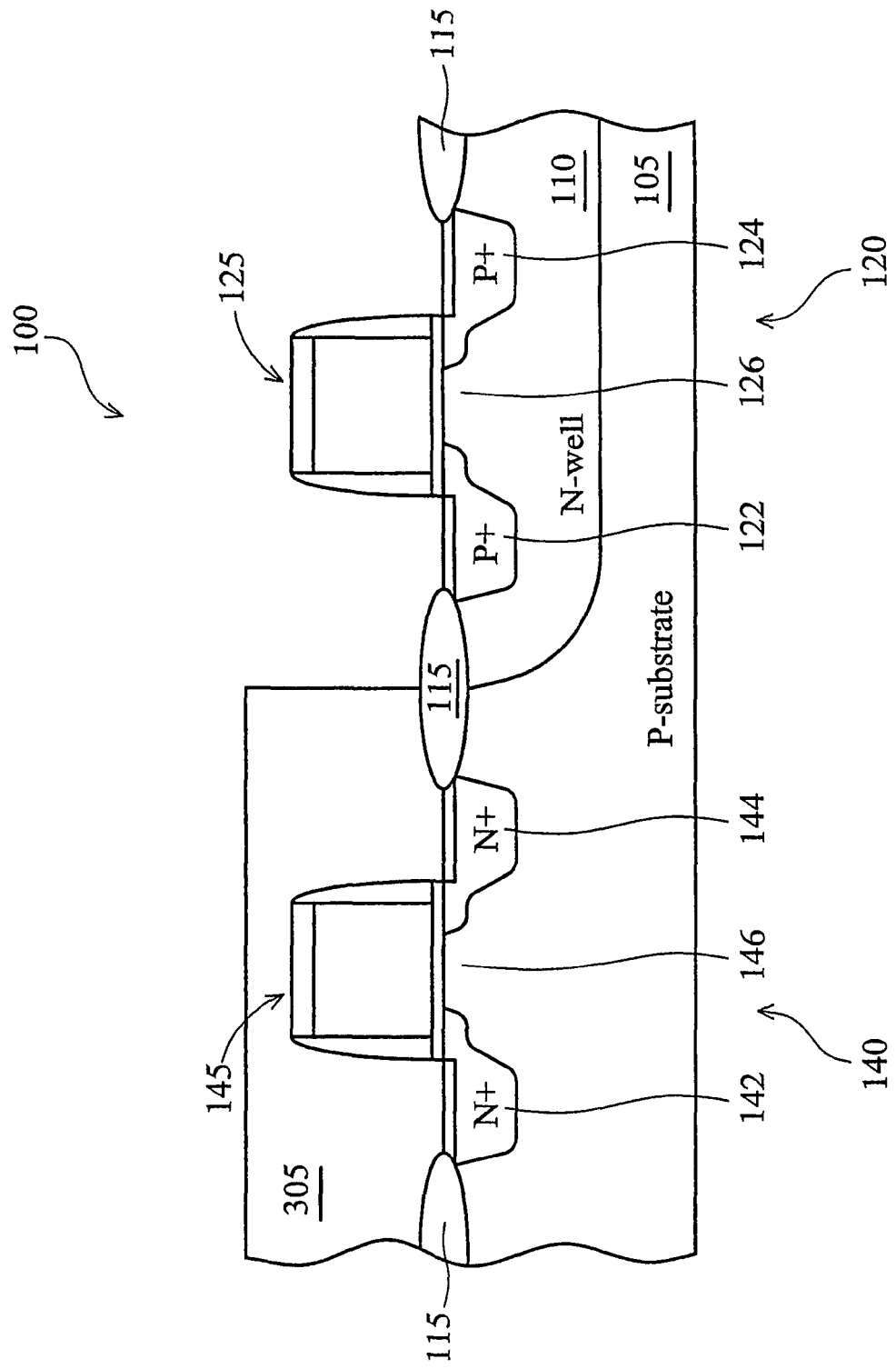
FIGS. 4a through 4j are a series of drawings illustrating in cross-section the stages of fabrication of a CMOS device according to an embodiment of the present invention.

FIGS. 4a-4j illustrate the fabrication of CMOS device 100 according to an embodiment of the present invention. FIG. 4a depicts the CMOS 100 of FIG. 2, to which has been added a patterned masklayer 305. The patterned mask layer 305 maybe composed of photoresist, silicon nitride or silicon oxide. Again, in FIGS. 4a through 4j some of the reference numbers used in FIG. 2 are omitted for clarity. Patterned mask layer 305 has been deposited, then exposed and developed to create the pattern shown in FIG. 4a. As is shown in the Figure, patterned mask layer 305 protectively covers the NMOS device 140 of CMOS device 100.

Figure 4B:
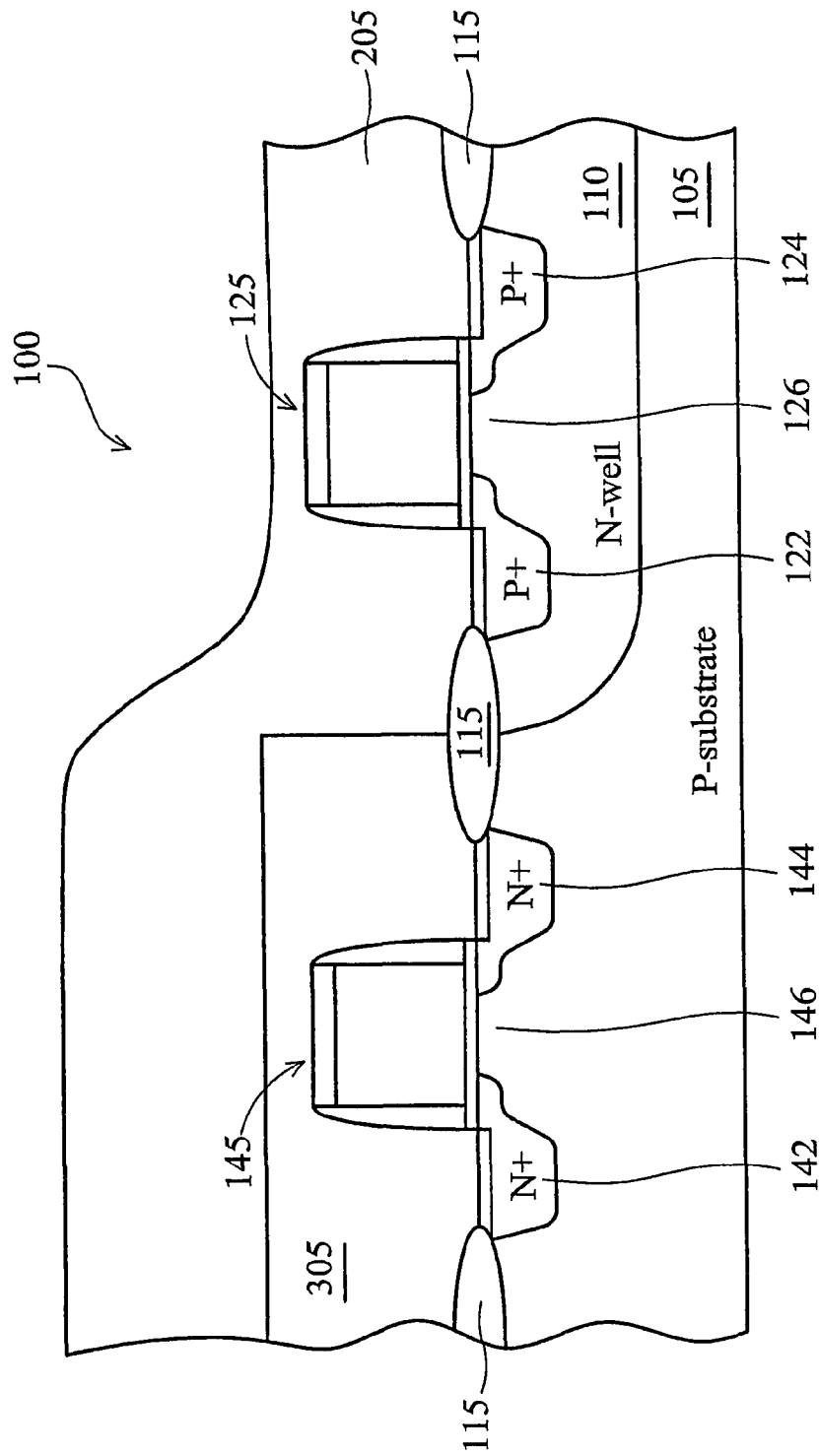
Figure 4C:
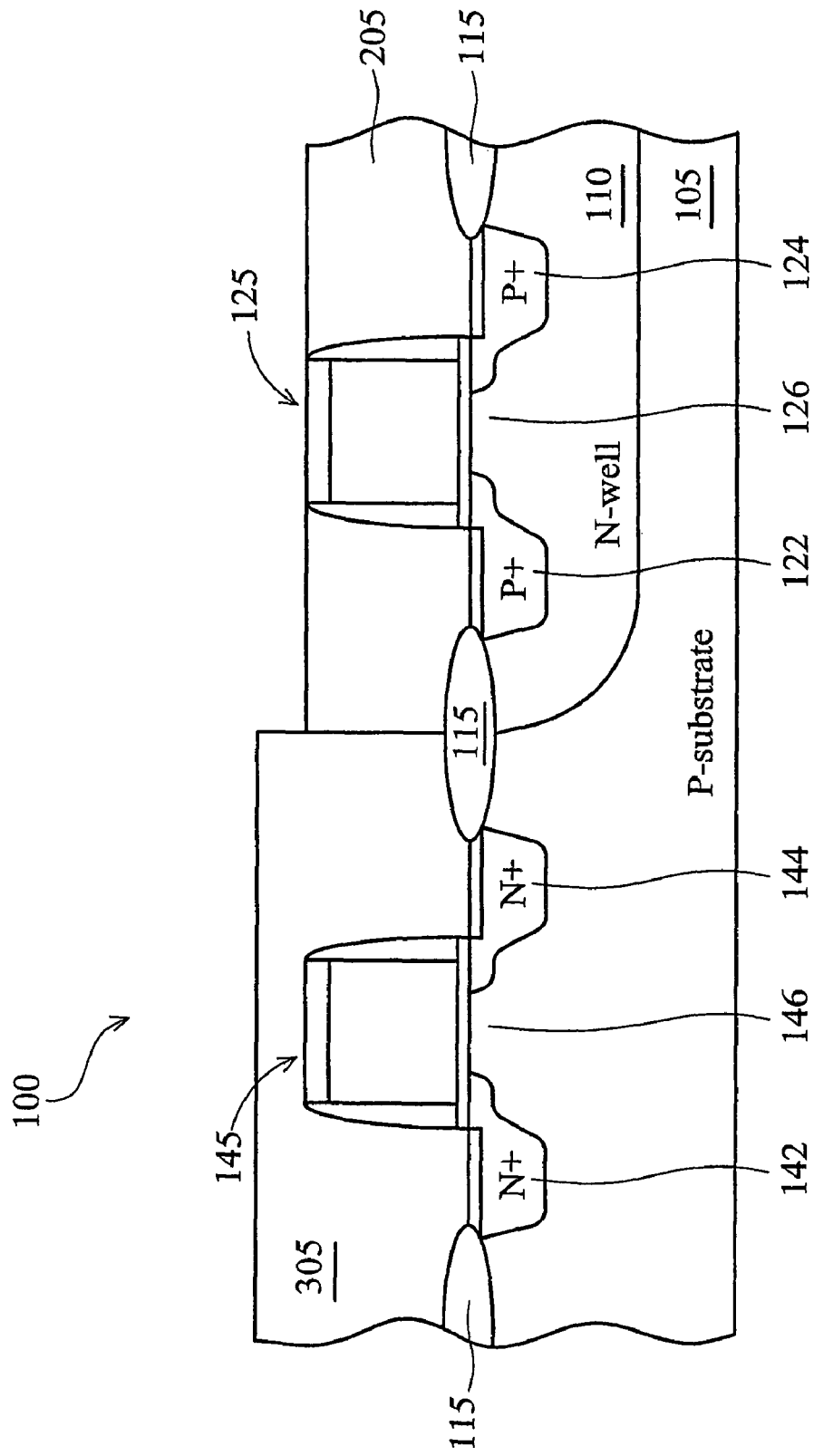
Figure 4D:
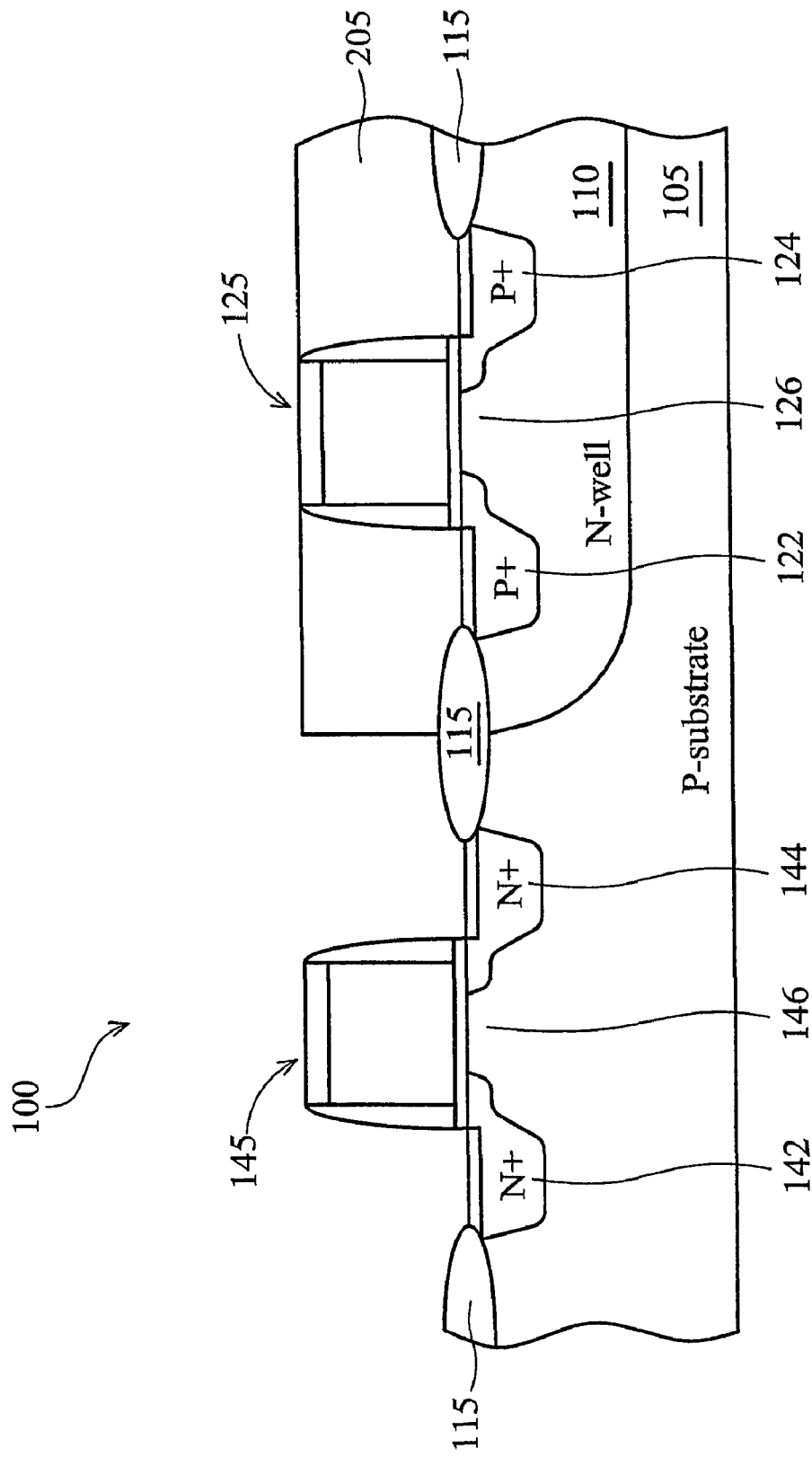

According to this embodiment, the next step in the fabrication process is to deposit a first compressive stress film 205, as shown in FIG. 4b. An etching procedure is then preformed to lower the upper extent of first compressive stress film 205 to the configuration illustrated in FIG. 4c. At this point, an appropriate solvent may be used to remove the patterned mask layer 305, leaving the remainder of CMOS device 100, including first compressive stress film 205, intact (See FIG. 4d).

Figure 4E:
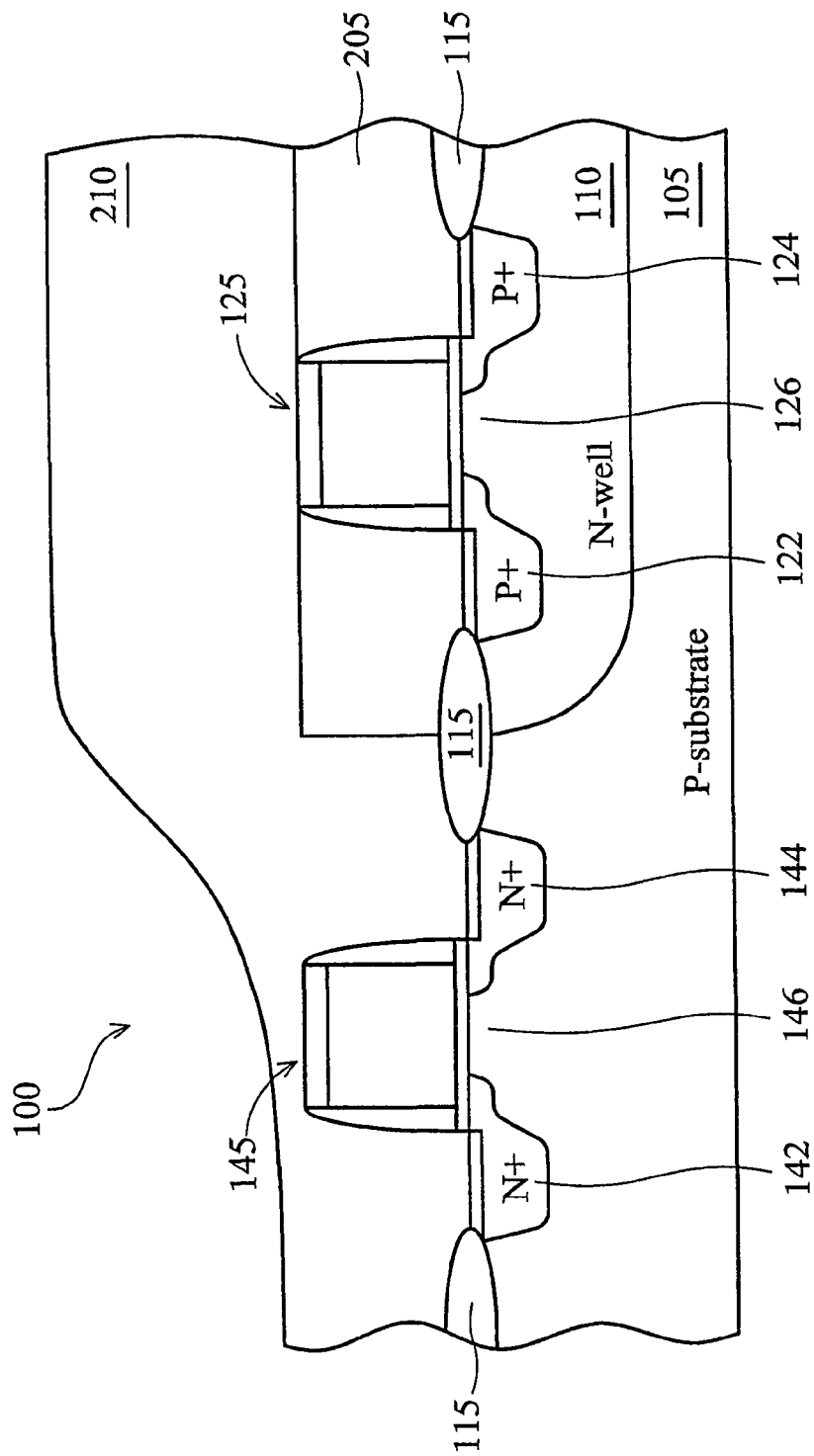
Figure 4F:
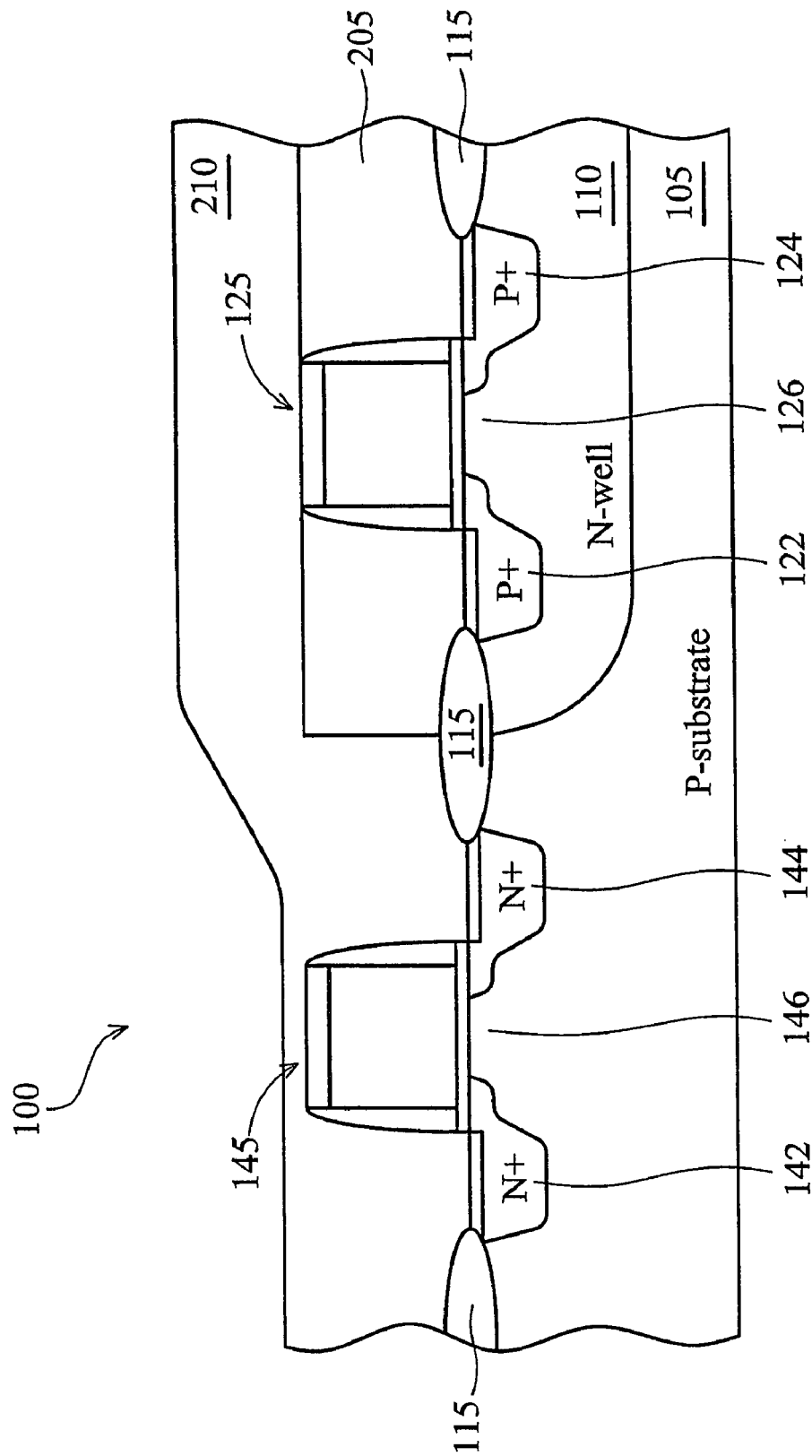
Figure 4G:
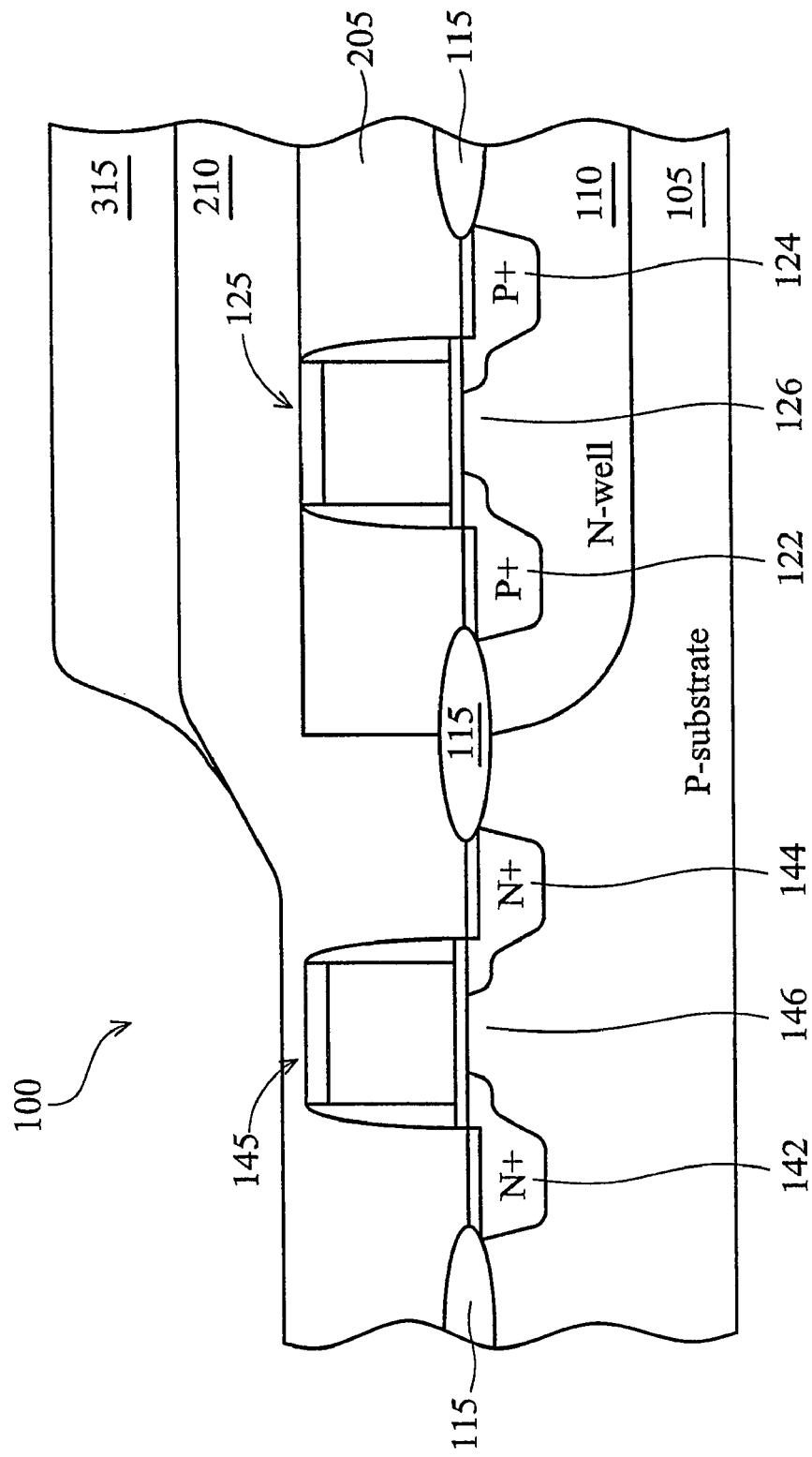

Next, in the embodiment of FIGS. 4a through 4j, a tensile stress film 210 is formed. This tensile stress film 210, as is illustrated in FIG. 4e, covers the CMOS device 100, including the just-formed first compressive stress film 205. An etching process may then be used to reduce the thickness of tensile stress film 210, and to reduce or eliminate the presence of tensile stress film 210 in the area immediately over NMOS gate 145. The resulting configuration is illustrated in FIG. 4f. Note that in other embodiments, this or other etching processes may be omitting if the layers can be formed in their final desired configuration. Selective etching or CMP may also be used. A second patterned photoresist layer 315 may then be deposited and patterned, resulting in the configuration illustrated in FIG. 4g. As shown in FIG. 4g, the second patterned photoresist layer 315 generally covers the PMOS device 120.

Figure 4H:
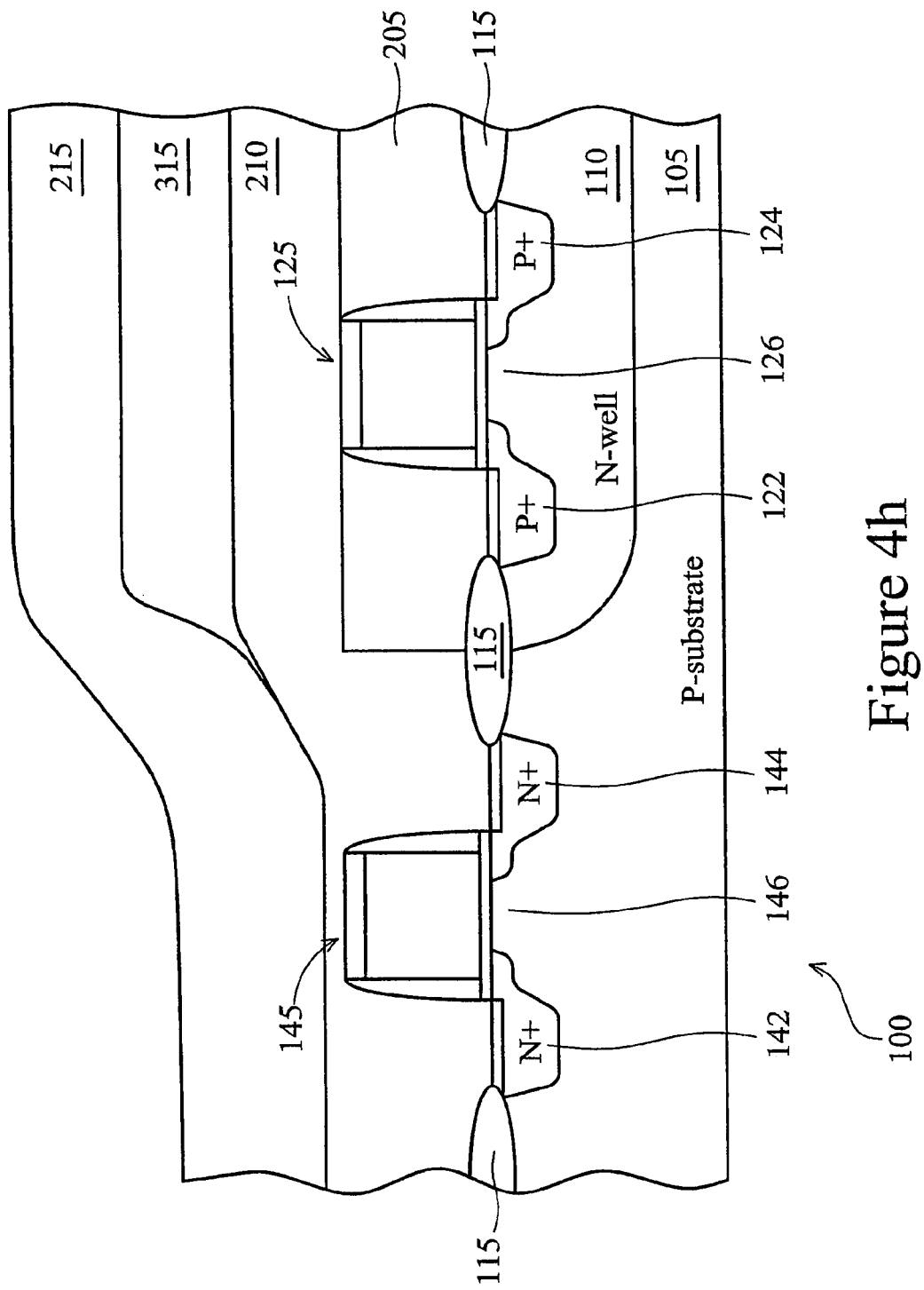
Figure 4I:
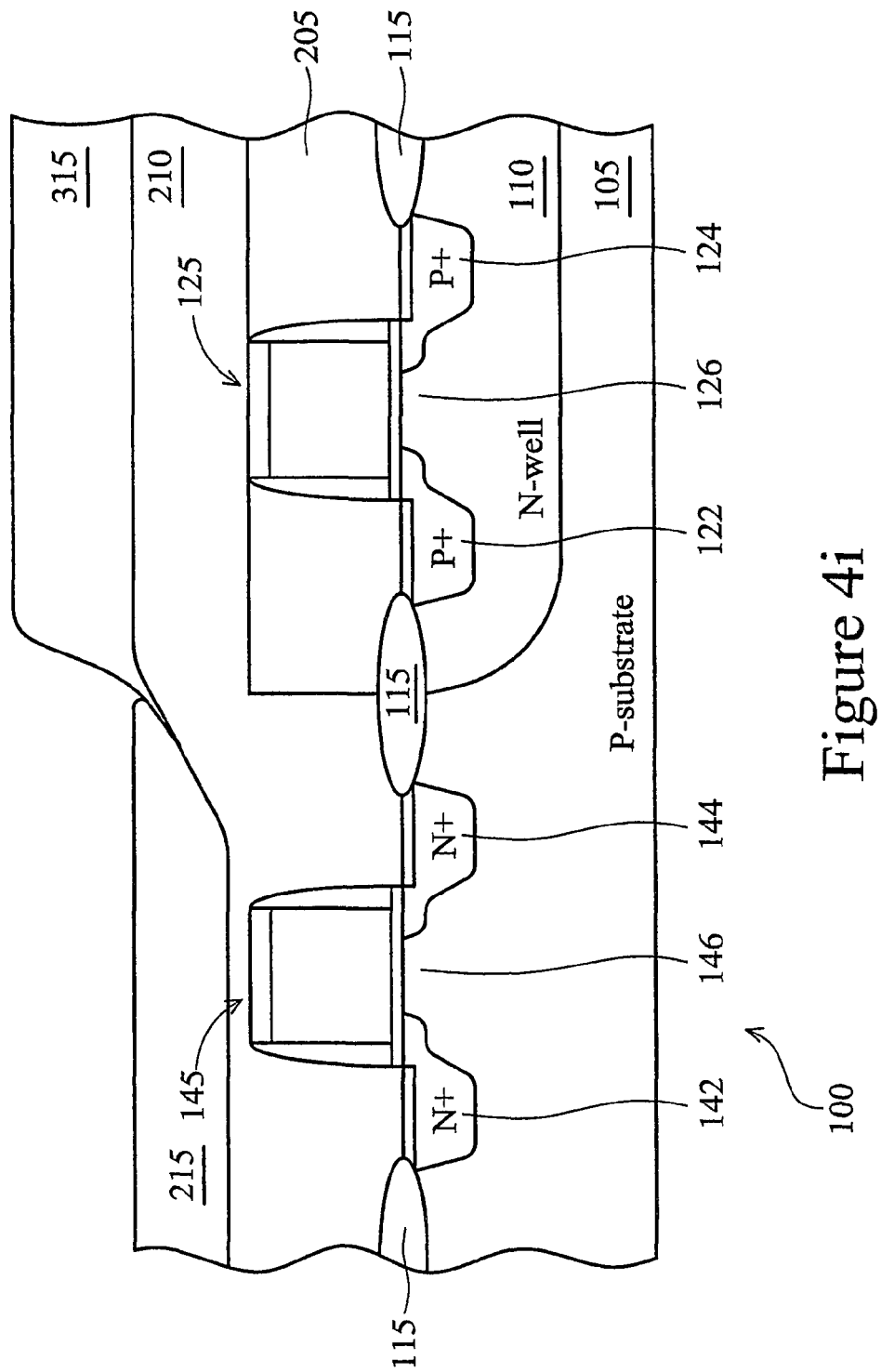
Figure 4J:
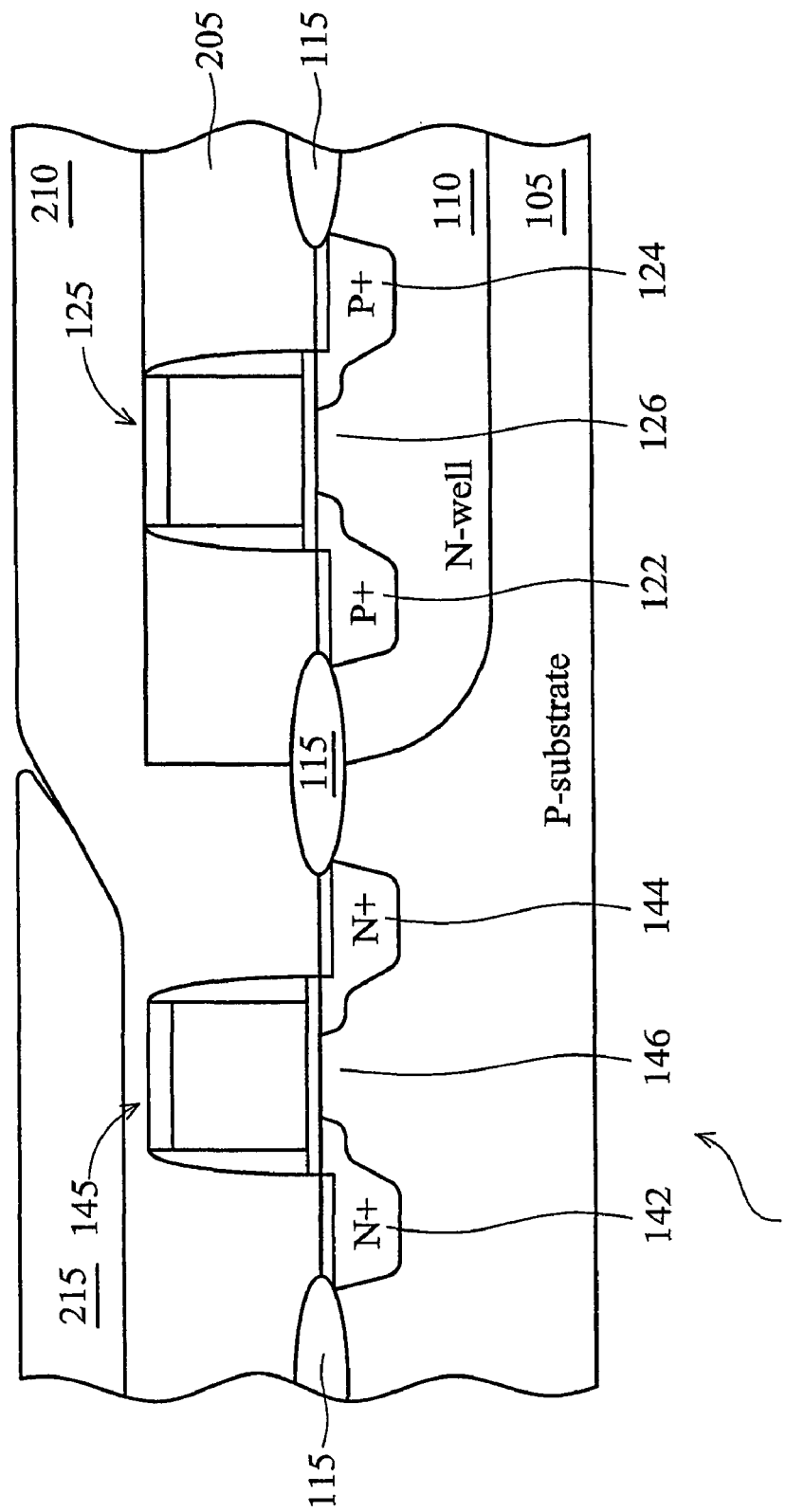

The final (second) compressive stress structure of this embodiment may now be added. The addition of compressive stress film 215 is illustrated in FIG. 4h. An etching or CMP step is then used, in this embodiment, to adjust the thickness of the record second compressive film 215 to its desired height. This stage of fabrication is illustrated in FIG. 4i. Finally, the photoresist structure 315 is removed, and an ILD layer 250 is formed uniformly over the entire structure. This stage is illustrated in FIG. 4j. Note that the fabrication of devices on the substrate may or may not be finished at this point. Note also that the process stops described above may be performed in any logical order unless recited to the contrary. In some embodiments, intermediate layers may be interposed between those described above, although in general, this is not preferred.

Figure 7:
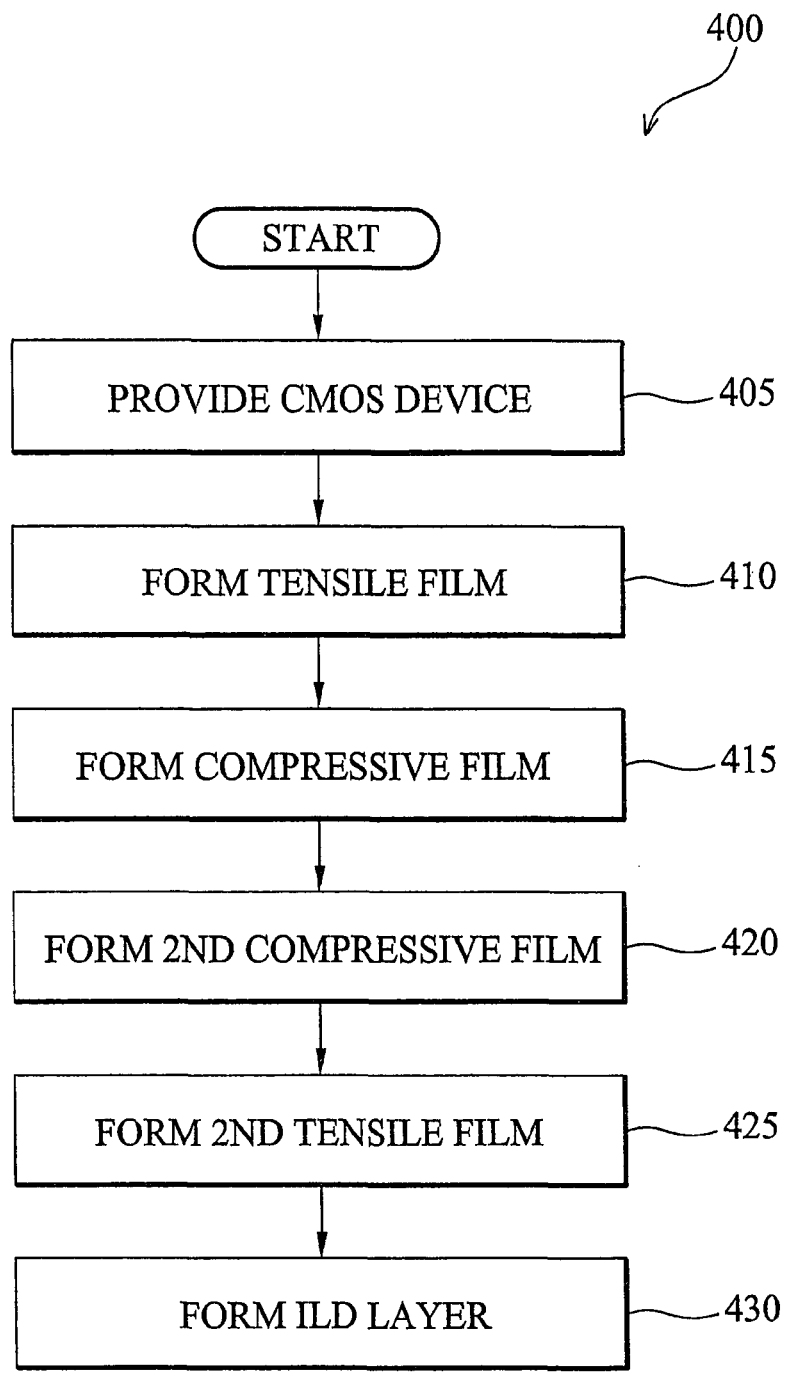
FIG. 7 is a flow diagram illustrating a method according to one embodiment of the present invention.

FIG. 7 is a flow diagram illustrating a method 400 according to an embodiment of the present invention. At START it is presumed that the equipment and materials needed to perform method 400 are operational and available. The process begins with providing a CMOS device consisting of an NMOSFET and a PMOSFET (step 405). The process continues with forming a first tensile film over the source region and the drain region of the NMOSFET (step 410). A first compressive stress layer is then formed over the source region and the drain region of the PMOS device (step 415). A second compressive layer is formed over the NMOSFET gate and the first tensile layer (step 420), and a second tensile layer is then formed over the PMOSFET gate region and over the first compressive layer (step 425). Optionally an ILD layer may then be formed (step 430). Again the steps of method 400 may be performed in any logically permissible order.

Figure 5A:
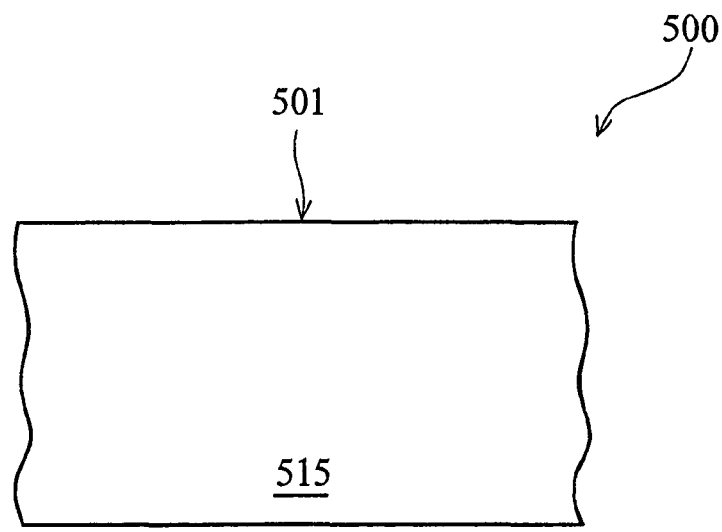
FIGS. 5a through 5g are a series of drawings illustrating in cross-section the stages of fabrication of a semiconductor device according to an embodiment of the present invention.

In another embodiment, the present invention is a semiconductor device such as an NMOS transistor that is formed with an ultra stressor layer. This embodiment is illustrated in FIGS. 5a through 5g. FIGS. 5a though 5g are a series of drawings illustrating in cross-section the stages of fabrication of a semiconductor device according to an embodiment of the present invention.

Figure 1:
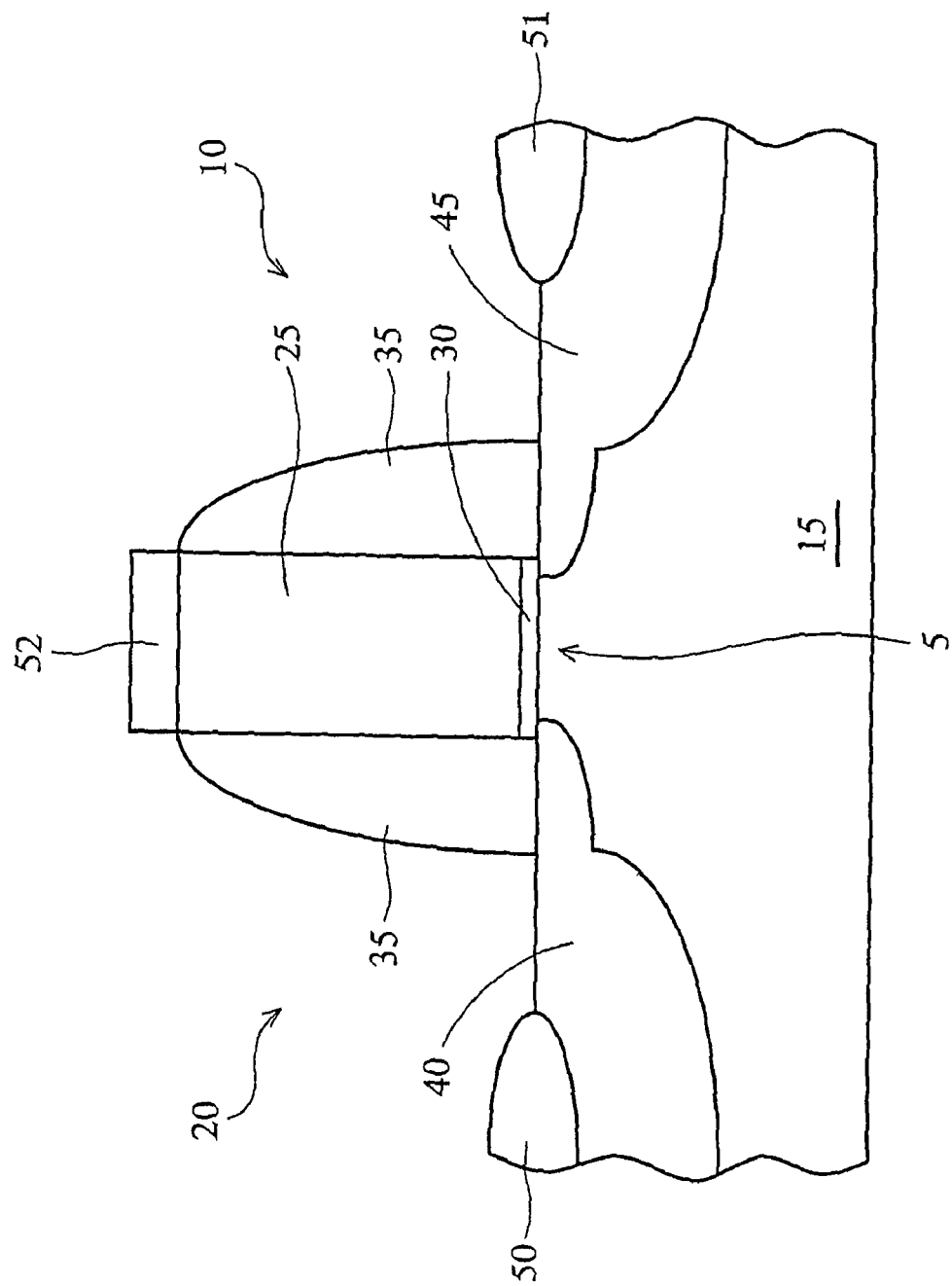
FIG. 1 is an illustration showing in cross-section the basic components of an exemplary MOSFET (metal-oxide semiconductor field effect transistor).

In FIG. 5a, a substrate 515 has been provided, in this embodiment of silicon, though a variety of other materials, such as silicon-germanium, may be used as well. Note that as used herein, the term 'substrate' may be the base silicon wafer upon which one or more integrated circuits are to be formed, or it may be the current layer upon which fabrication is occurring. Semiconductor devices may be formed in a number of layers, with the separate components formed on each layer connected by conducting interconnecting structures. For simplicity, however, in this disclosure the substrate will simply be the layer currently forming the outer surface of the wafer at a given stage of fabrication. Note also that in FIGS. 5a through 5g, features similar to those shown in FIG. 1 may be analogously though not identically numbered. This is done for convenience in comparing the various embodiments of the present invention with each other and with the prior art, but does not imply the analogously-numbered structures are identical in nature unless explicitly stated or evident from the context. Substrate 515 provides a platform for the fabrication of semiconductor device 500, which has a top (currently exposed) surface 501.

Figure 5B:
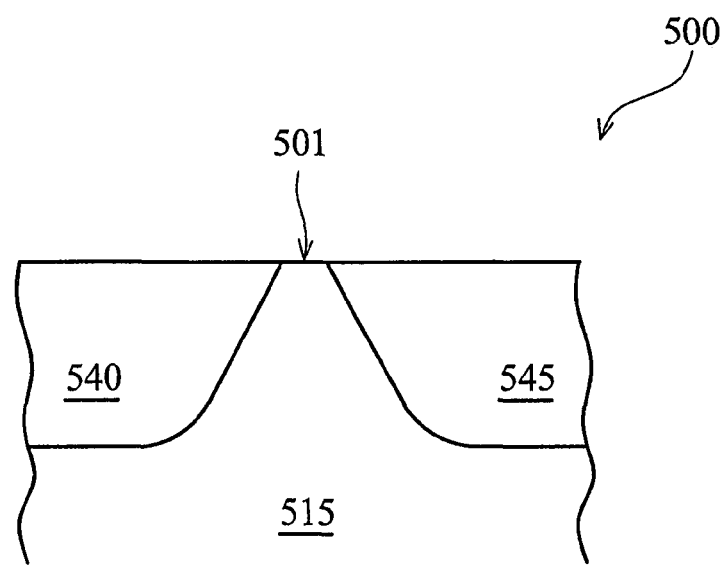

Fabrication of semiconductor device 500 begins with the provision of substrate 515 and continues with the selective doping of certain regions to create the source and drain regions for the transistor being constructed. This selective doping may, for example, be performed by protecting certain portions of the top surface 501 of substrate 515 with a patterned photoresist layer (not shown), and then exposing the semiconductor device 500 to ionized phosphorus. FIG. 5b illustrates the stage of fabrication after source region 540 and drain region 545 have been created in this fashion and the (selectively) protective photoresist layer has been removed. Note that in FIG. 5a, the top 501 and bottom surfaces are shown, while FIG. 5b through 5g illustrate only the top portion of the substrate—the portion at which the semiconductor device 500 is being fabricated.

Figure 5C:
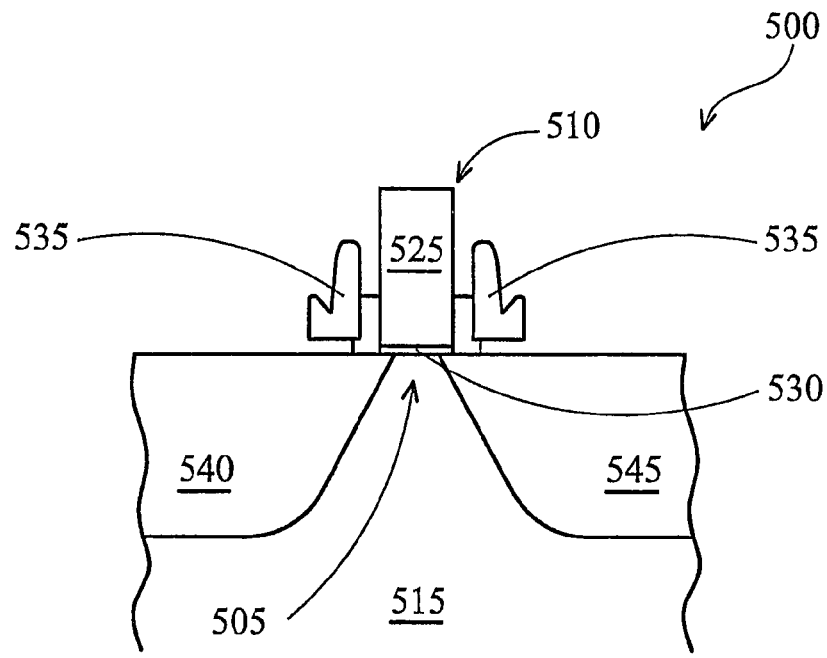

The fabrication of the semiconductor device 500 according to the illustrated embodiment continues with the addition of a transistor 510. Transistor 510, which includes a gate oxide 530 and a gate electrode 525 between spacers 535, is typically fabricated in a number of steps that are known in the art and therefore not recited individually here. Note that the transistor 510 is similar thought not identical to the transistor 10 of FIG. 1, though with some of the features omitted for clarity. In transistor 510, electrical current will flow through the channel 505 formed in substrate 515 between source region 540 and drain region 545 when a voltage has been applied to gate electrode 525. The semiconductor device 500 at this stage of fabrication is illustrated in FIG. 5c.

Figure 5D:
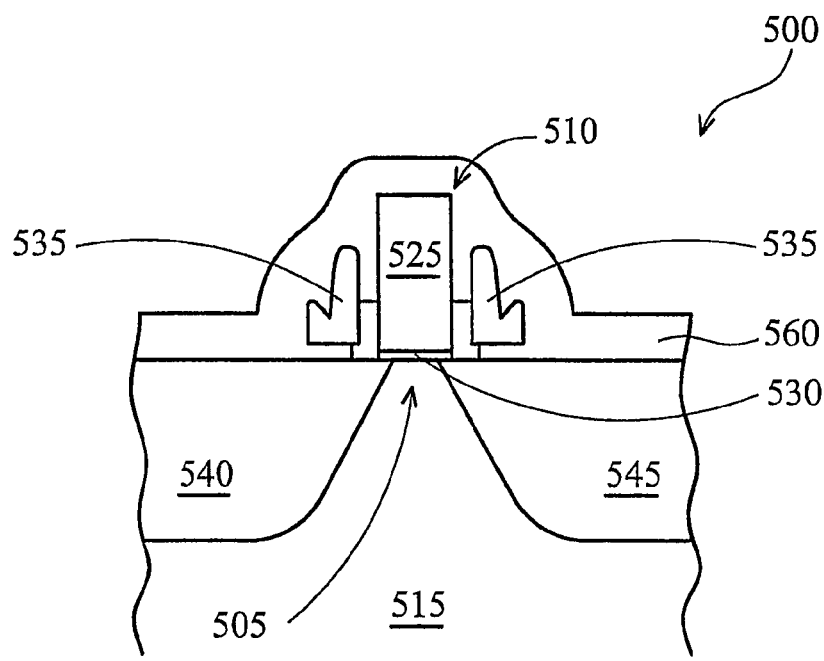
Figure 5E:
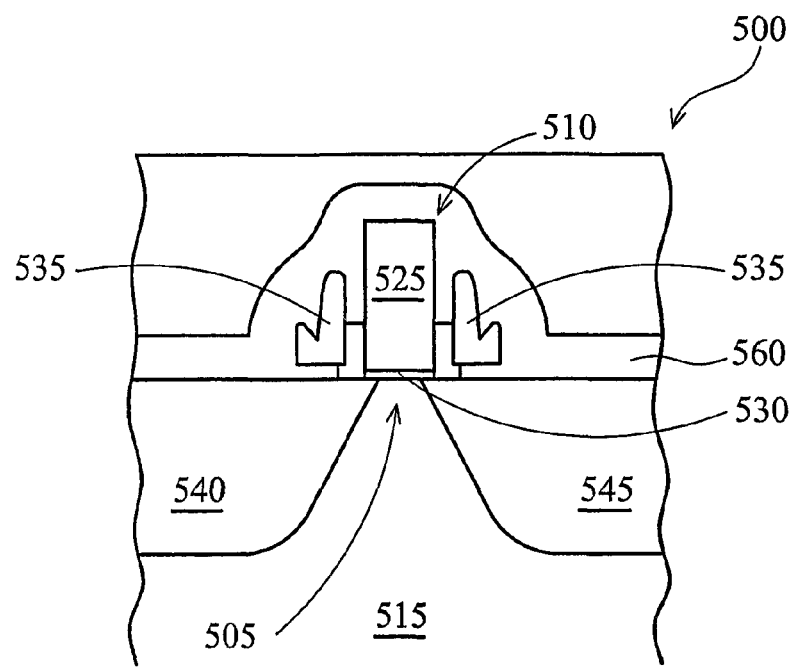

The fabrication of semiconductor device 500 continues with the formation of a contact etch stop layer 260, as shown in FIG. 5d. The contact etch stop layer 560 is formed over the entire transistor 510, include source region 540 and drain region 545. And interlayer dielectric (ILD) layer 565 is then formed on top of the contact etch stop layer 560. In this embodiment, the ILD layer 565 is substantially planarized using, for example a chemical-mechanical polishing (CMP) operation, resulting in the structure shown in FIG. 5e. The semiconductor device is now ready for the addition of the ultra-stressor layer.

Figure 5F:
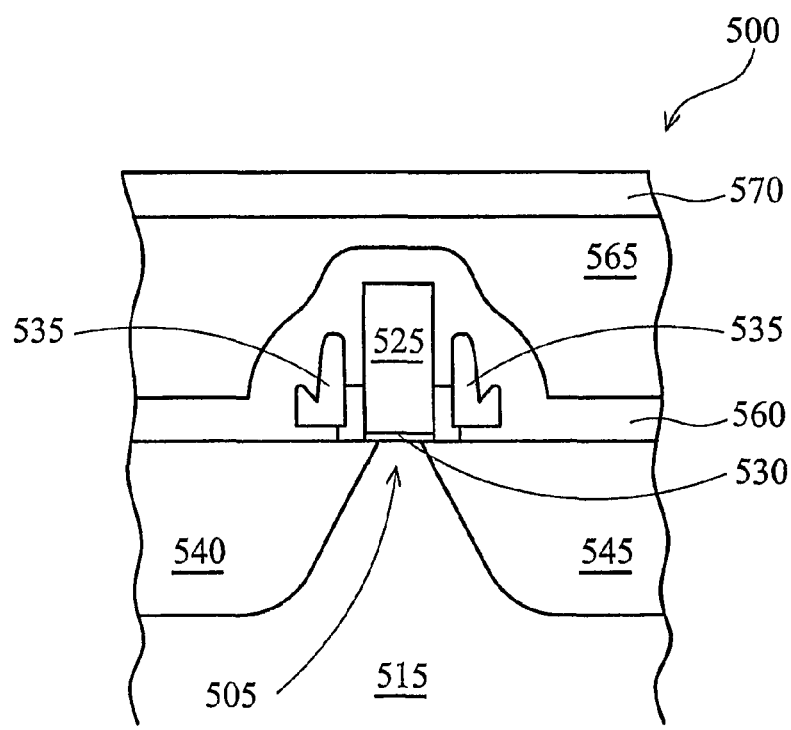

In accordance with the illustrated embodiment of the present invention, the ultra-stressor layer is ILD stressor layer 570 formed over the top of CMP planarized ILD layer 565. The resulting structure is shown in FIG. 5f. In this embodiment of the present invention, ILD-stressor layer 570 is preferably comprises silicon nitride (SiN), though other suitable materials may be instead or in addition. In an NMOS device, the ILD stressor layer 570 is preferably formed using a thermal chemical vapor deposition (CVD) technique to create a compressive stress because n-drive current flow is enhanced by tensile stress. When SiN is used for the ILD stressor, the resulting material is sometimes referred to as C—SiN.

Figure 5G:
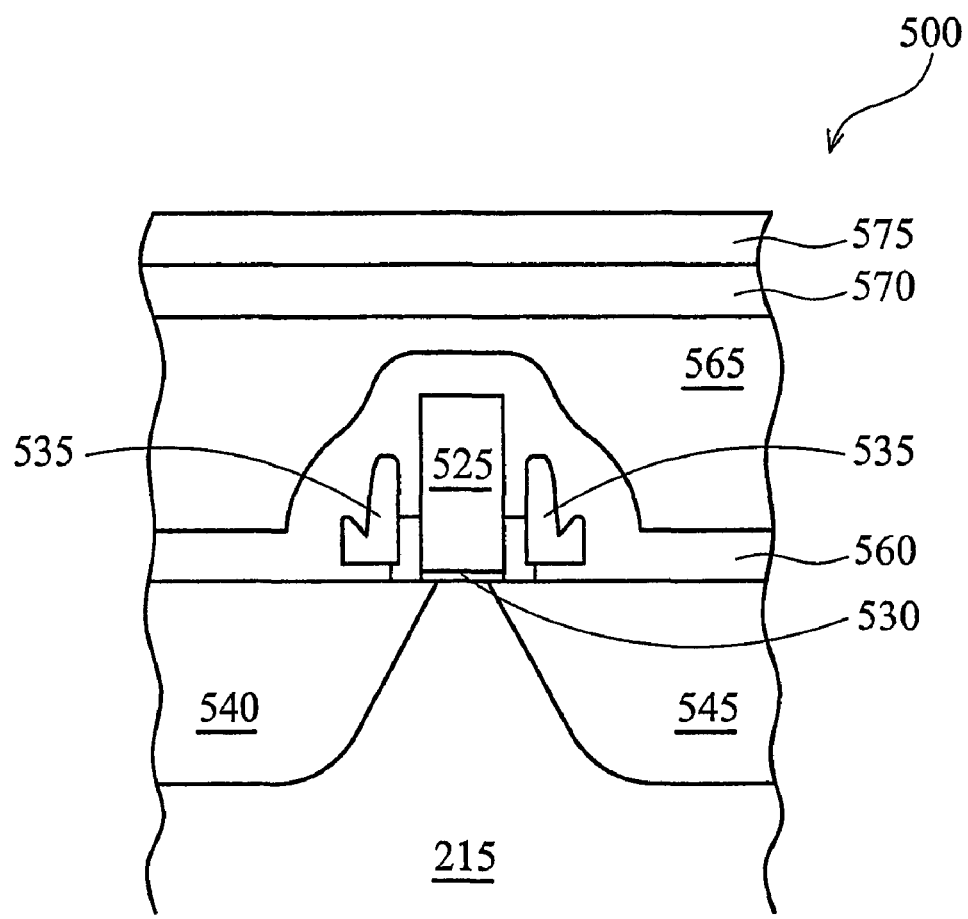

In a PMOS device, on the other hand, the ILD-stressor layer 570 is preferably formed using a plasma-enhanced CVD technique to create a tensile stress, which enhances p-driven current. When SiN is deposited using plasma-enhanced CVD, the resulting material may be referred to as T-SiN. In either case, the ILD-stressor layer 570 may then be covered with an inter-metal dielectric layer 575, as shown in FIG. 5g. The device is then ready for further fabrication steps or packaging, as the particular application being served necessitates.

In another embodiment (not shown), the present invention is a CMOS device having an NMOS transistor formed adjacent a CMOS transistor (though electrically isolated from each other, perhaps using a shallow trench isolation structure). In this embodiment, the source and drain regions of the respective NMOS and PMOS devices are separately formed because they are doped using different ions. Once the source and drain regions are formed, however, the transistors themselves may be formed either simultaneously or in series. Once formed, the adjacent transistors are covered by a contact etch stop layer that is formed directly over them.

As with the single transistor illustrated in FIGS. 5a through 5g, the CMOS device formed of the NMOS transistor and the adjacent PMOS transistor are then covered by an ILD layer, which on a preferred embodiment is formed directly over the contact etch stop layer. A CMP planarization step is then performed, which may uniformly planarize the ILD layer or reduce it to one level over the NMOS transistor and another over the PMOS transistor.

An ILD-stressor layer is then added. In a preferred embodiment, the ILD stressor layer is SiN. The deposition of the ILD stressor layer may be done in a single process step, but in a particularly preferred embodiment, it is deposited so as to form a T-SiN layer over the PMOS transistor and a C—SiN layer over the NMOS transistor. In this way, the performance of both transistors is enhanced.

Figure 6:
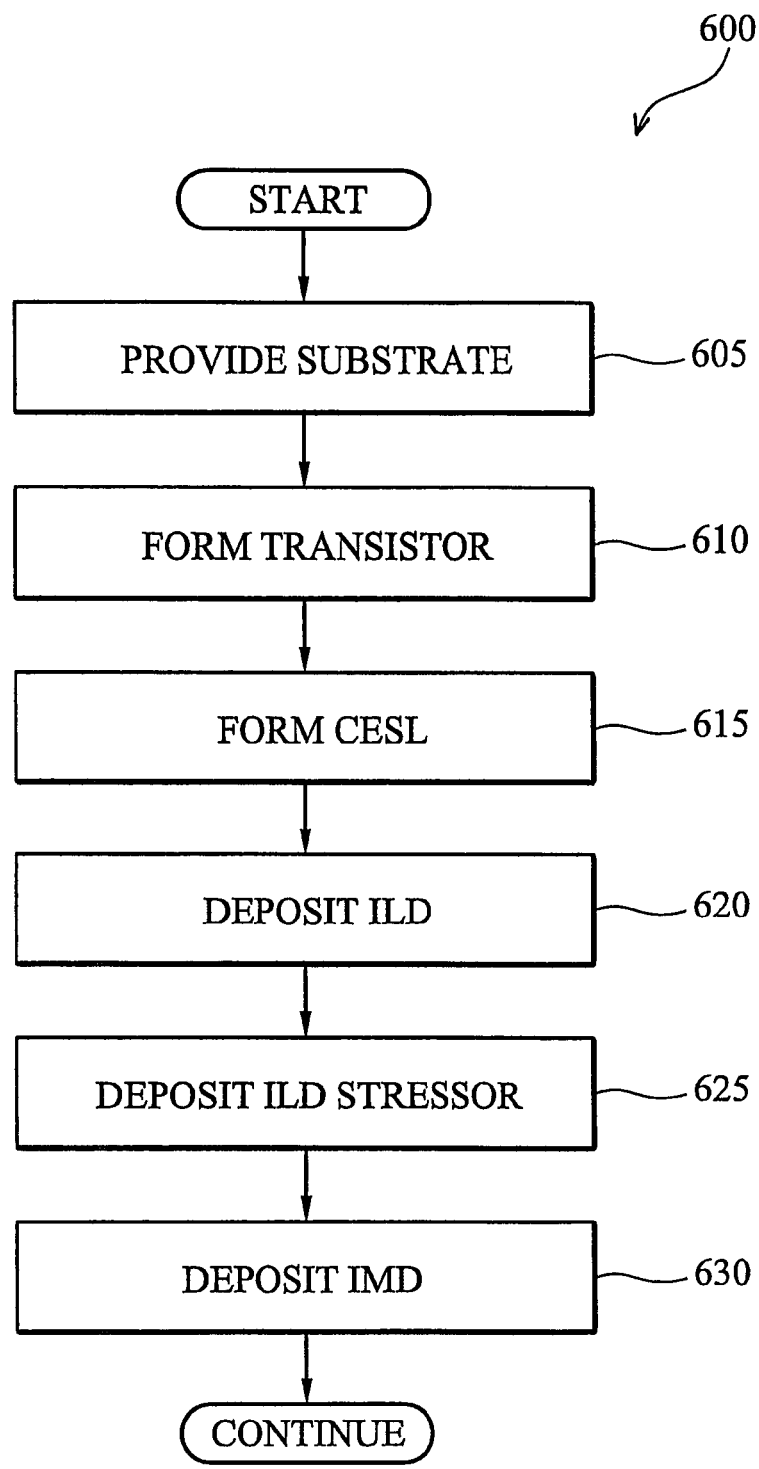
FIG. 6 is a flow diagram illustrating a method according to one embodiment of the present invention.

FIG. 6 is a flow diagram illustrating a method 600 of fabricating a semiconductor device according to an embodiment of the present invention. At START is assumed that the materials and tools for fabrication are available an operational to fabricate the device according to the present invention. The process begins with the provision of a substrate such as a silicon wafer (step 605). One or more transistors are then formed (step 610). A contact etch stop layer (CESL) is then formed over each of the transistors (step 615). Above the CESL, an ILD is deposited (step 620). An ILD-stressor layer is then added (step 625). Finally, an IMD is formed on top of the ILD-stressor (step 630). The method 600 then continues with packaging or further fabrication steps, as appropriate.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A CMOS device comprising a n-type transistor and a p-type transistor, each transistor having a source region, a drain region, and a gate structure, said CMOS device comprising:
   a first tensile stress layer disposed over the n-type transistor source region and the n-type transistor drain region, the first tensile stress layer having a thickness at least equal to a height of the n-type transistor gate structure;
   a first compressive stress layer over the n-type transistor gate structure;
   a second compressive stress layer disposed over the p-type transistor source region and the p-type transistor drain region, the second compressive stress layer having a thickness at least equal to a height of the p-type transistor gate structure; and
   a second tensile stress layer over the p-type transistor gate structure.

2. The CMOS device of claim 1, wherein the first compressive stress layer and the second compressive stress layer are integral.

3. The CMOS device of claim 1, wherein the first tensile stress layer and the second tensile stress layer are integral.

4. A semiconductor device, comprising:
   a substrate;
   at least one transistor formed on the substrate, the transistor comprising a gate electrode;
   a contact etch stop layer formed over the transistor and a top surface of the gate electrode, the contact etch stop layer contacting the top surface of the gate electrode;
   an inter-layer dielectric (ILD) formed over and contacting the contact etch stop layer; and
   an ILD-stressor layer formed over and contacting the ILD, wherein the ILD-stressor layer causes a tensile stress or a compressive stress in a channel of the at least one transistor in a direction of a current flow.

5. The semiconductor device of claim 4 wherein the at least one transistor is a p-type transistor.

6. The semiconductor device of claim 4, wherein the at least one transistor is an n-type transistor.

7. The semiconductor device of claim 4, wherein the at least one transistor comprises an n-type transistor formed adjacent to a p-type transistor.

8. The semiconductor device of claim 7, wherein an ILD-stressor layer is formed over the n-type transistor and over the p-type transistor.

9. The semiconductor device of claim 8, wherein the ILD-stressor layer over the p-type transistor is integral to the ILD-stressor over the n-type transistor.

10. The semiconductor device of claim 4, wherein the ILD-stressor layer comprises silicon nitride (SiN).

11. The semiconductor device of claim 10, wherein the ILD-stressor layer is a T-SiN layer.

12. A method of fabricating a semiconductor device, comprising:
   providing a substrate;
   forming a transistor on the substrate, wherein the transistor comprises a gate electrode;
   forming an etch stop layer over the substrate and over and contacting a top surface of the gate electrode;
   forming an ILD over and contacting the etch stop layer; and
   forming an ILD-stressor over and contacting the ILD, wherein the etch stop layer and the ILD are interposed between the top surface of the gate electrode and the ILD-stressor, wherein the ILD-stressor causes a tensile stress or a compressive stress in a channel of the transistor in a direction of a current flow.

13. The method of claim 12, wherein the transistor is an n-type transistor.

14. The method of claim 13, further comprising forming a second transistor adjacent to the transistor.

15. The method of claim 14, wherein the second transistor is a p-type transistor.

16. The method of claim 15, wherein the n-type transistor and the p-type transistor are each covered by the etch stop layer.

17. The method of claim 16, wherein the ILD-stressor is formed of SiN.

18. The method of claim 17, further comprising performing chemical metal polishing (CMP) after forming the ILD and before forming the ILD-stressor.

* * * * *